US009046359B2

(12) United States Patent
Skidmore et al.

(10) Patent No.: US 9,046,359 B2
(45) Date of Patent: Jun. 2, 2015

(54) RANGE IMAGING DEVICES AND METHODS

(75) Inventors: Jay A. Skidmore, San Jose, CA (US); Victor Rossin, Mountain View, CA (US); Pierre Doussiere, Sunnyvale, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 376 days.

(21) Appl. No.: 13/478,902

(22) Filed: May 23, 2012

(65) Prior Publication Data

US 2013/0314693 A1    Nov. 28, 2013

(51) Int. Cl.
*G01C 3/08* (2006.01)
*G01S 13/88* (2006.01)
*H01S 5/40* (2006.01)
*H01S 5/024* (2006.01)

(52) U.S. Cl.
CPC . *G01C 3/08* (2013.01); *G01S 13/88* (2013.01); *H01S 5/02461* (2013.01); *H01S 5/02469* (2013.01); *H01S 5/02476* (2013.01); *H01S 5/4031* (2013.01)

(58) Field of Classification Search
CPC .......... G01C 3/08; G01S 7/481; G01S 17/89; G01S 7/4814; H01S 5/4025; H01S 5/02272; H01S 5/028
USPC ........................... 356/3.01–28.5; 3/3.01–28.5
See application file for complete search history.

(56) References Cited

U.S. PATENT DOCUMENTS

2002/0003617 A1 *  1/2002  Doemens et al. ............ 356/4.01
2006/0018355 A1 *  1/2006  Feitisch et al. ............. 372/50.12

* cited by examiner

*Primary Examiner* — Luke Ratcliffe
(74) *Attorney, Agent, or Firm* — JDS Uniphase Corporation

(57) ABSTRACT

An array of laser diode emitters is used as an illumination source for a range imaging system. The laser diode emitters are disposed on a common substrate. When one of the emitters fails, the remaining emitters emit enough light to meet the output optical power specification. The emitters can be disposed with a tight spacing. The tight spacing facilitates packaging of the entire array into a compact single package on a common heat sink.

11 Claims, 3 Drawing Sheets

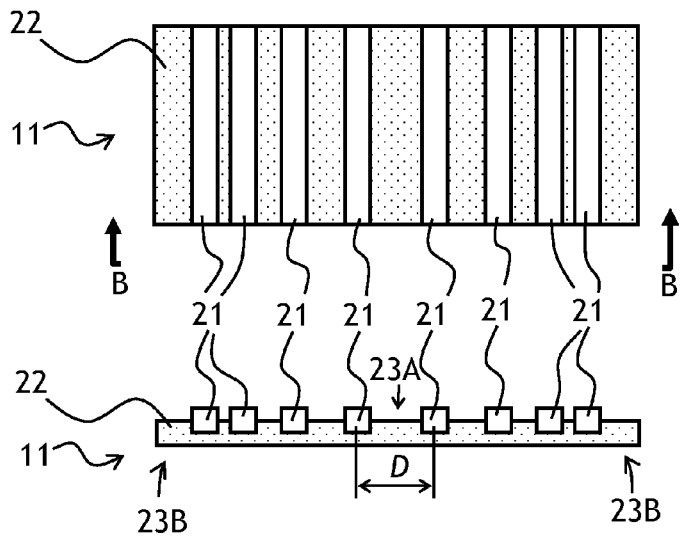
*FIG. 2A*
*FIG. 2B*
*FIG. 2C*
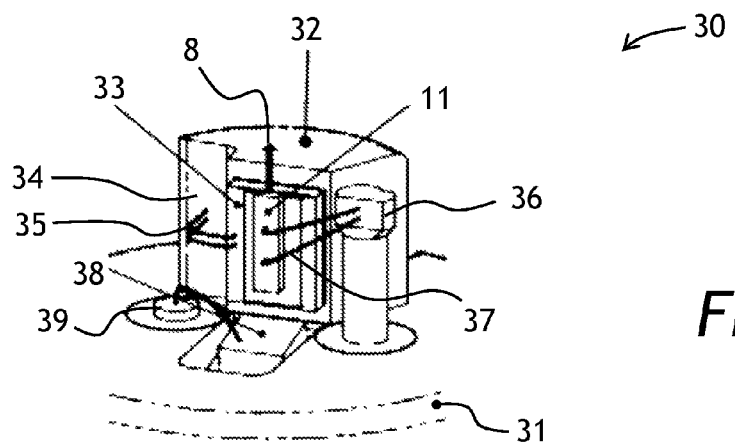
*FIG. 3*

RANGE IMAGING DEVICES AND METHODS

TECHNICAL FIELD

The present invention relates to range imaging, and in particular to devices and methods for range imaging of an object using pulsed or modulated illumination of the object.

BACKGROUND OF THE INVENTION

In range imaging, each pixel of a two-dimensional image of a three-dimensional scenery is associated with information about a distance from an imaging point to a point in the scenery imaged by that pixel. In other words, each pixel includes a distance-to-object information in addition to the brightness and/or color information. Range imaging is used in applications where distance to and/or three-dimensional shape of objects being imaged needs to be determined, such as 3D profiling, gaming, human-to-computer interface, vision through fog, automotive, machine vision, etc.

Range imaging is based on measuring, for every pixel of the image, of the time that it takes light to propagate from a light source to the object and back to the detector. One type of a range imaging system is similar to radar. A narrow-beam laser pulse is emitted towards an object, and the strength (optical power) of the laser pulse reflected from a part of the object illuminated by the pulse is measured. The time delay between the emitted pulse and the reflected pulse is also measured. The laser beam is steered in a raster fashion, and the measurements are repeated for each angle of the beam. In this way, a raster image is obtained, in which every pixel is associated with a time delay, which corresponds to amount of time that took the emitted laser pulse to propagate towards the object and back towards the detector. The amount of time is proportional to a distance to the part of the object illuminated with the laser beam.

A more efficient approach utilizes a laser source whose output is spatially modified to form a particular pattern of dots on the object. The reflected pattern is detected and the spatial information is decoded via triangulation to detect the position of the object.

A faster approach to range imaging consists in using so called gated detector arrays. A single broad-beam light pulse illuminates the entire scenery to be imaged. The detector array is "gated", that is, it is equipped with an electronic gate or shutter that makes the detector array responsive to light only during a narrow time window when the "gate" is open. The moment of opening the "gate" is delayed by a delay time with respect to the moment the light is emitted. The emitted light propagates a pre-defined distance corresponding to the delay time, reflects from an object located at that distance, and propagates back. Any light reflected from an object located before or after the pre-defined distance will be suppressed by the gated detector array. The time delay is varied to obtain 3D imagery slice-by-slice.

A gated detector array approach can be useful for imaging through fog, for example. Light reflections from a fog patch, which would normally obscure objects located beyond the fog patch, can be suppressed by setting the pre-defined distance to be larger than the fog patch thickness.

Yet another approach to range imaging consists in modulating the illuminating light at a high (radio) frequency and detecting, for each pixel of a detector array, a modulation phase delay between the illuminating light and light detected by the pixel. The modulation phase delay is proportional to a distance from the imaging point to a point in the scenery imaged by the pixel. One advantage of this approach is that the need in high peak intensity pulsed light sources is eliminated, which, however, comes at a cost of reduced sensed distance range due to aliasing effects. The reduced distance range is perhaps of less importance in gaming or gesture recognition applications, where the user is typically positioned within a known and relatively narrow range of distances from the gaming console or a computer system.

Cameras based on gated detector arrays or on detector arrays sensitive to modulation phase have been termed "time-of-flight cameras" because they are sensitive to time it takes the illuminating light to propagate towards the object and back to the camera. Time-of-flight cameras began to emerge when semiconductor devices became fast enough to process images at practical frame rates of tens of frames per second.

In any of the above range imaging methods, strict requirements are imposed on illuminating light sources. They have to be fast, powerful, and reliable. Modulation frequency is typically in the order of 100 MHz, with rise/fall times on the order of 1 ns to achieve the desired accuracy. Laser diodes and high-brightness light-emitting diodes (LEDs) are frequently used for this application at power levels of hundreds of milliwatts to Watts to achieve distances that allow computer or living room operation, respectively. Infrared laser diodes and LEDs are employed to avoid dazzling users with bright light.

The reliability and lifetime requirements for laser diodes are particularly difficult to meet. For gaming and computer interface/gesture recognition applications, the illumination levels have to remain relatively unchanged for tens of thousands hours of operation. At present, very few, if any, laser diodes or LEDs can provide Watt-level illumination with adequate reliability. When the illumination levels decrease due to aging of the laser diodes and/or LEDs, time-of-flight cameras cease to operate with the desired level of performance.

An object of the present invention is to provide an illumination source reliable enough for use in range imaging systems, and in particular in time-of-flight camera systems.

SUMMARY OF THE INVENTION

According to the invention, an array of laser diode emitters on a common semiconductor substrate can be used in place of a single-emitter laser diode for redundancy. When one of the emitters fails, the remaining emitters can emit enough light to meet the output power specification. When the emitters are connected in parallel, a failure of a single emitter has a relatively small effect on the output optical characteristics such as output power and response time. The emitters are preferably disposed with a tight spacing that facilitates packaging of the entire array into a compact single package on a common heat sink. In one embodiment, the emitters are spaced in a non-uniform manner, the spacing decreasing in going from the center of the array to its edges. The non-uniform spacing can reduce thermal gradients, which helps reduce wavelength spread of individual laser diode emitters.

In accordance with the invention there is provided a range imaging system comprising an illuminator for providing pulsed or modulated illumination of an object, and an optical camera for time-gated or phase-sensitive imaging of the object illuminated with the illuminator. The illuminator comprises a laser diode array including a plurality of laser diode emitters on a common semiconductor substrate. A controller can be provided to generate an object depth map from phase or time delays resulting from propagation of light emitted by the illuminator to the object and back to the optical camera.

In accordance with another aspect of the invention there is further provided a laser diode array comprising a semiconductor substrate and a plurality of laser diode emitters on the semiconductor substrate, wherein the laser diode emitters are non-uniformly spaced along the array, the emitter spacing decreasing from the middle of the array to its edges, to reduce thermal gradients and associated emitter-to-emitter wavelength spread during operation of the array.

In accordance with another aspect of the invention there is further provided a method for range imaging of an object, comprising:

operating a laser diode array including a plurality of laser diode emitters on a common semiconductor substrate, to provide pulsed or modulated illumination of the object; and operating, in synchronism with the laser diode array, an optical camera for time-gated or phase-sensitive imaging of the object, to provide an object depth map from phase or time delays resulting from propagation of light emitted by the illuminator to the object and back to the optical camera.

In one embodiment, output power of the array is monitored to determine a drop of optical power due to a failure of at least one of the plurality of the emitters of the array. Upon determining the drop, the supply current is increased, so as to lessen a drop of output optical power of the array caused by the fault.

BRIEF DESCRIPTION OF THE DRAWINGS

Exemplary embodiments will now be described in conjunction with the drawings, in which:

FIG. 2A is a top view of a laser diode array of the invention for use in the range imaging system of FIG. 1;

FIG. 2B is an end view of the laser diode array of FIG. 2A taken along lines B-B of FIG. 2A;

FIG. 2C is a distribution of emitter spacing of the laser diode array of FIGS. 2A and 2B;

FIG. 3 is a three-dimensional view of a packaged laser diode array of FIGS. 2A and 2B;

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
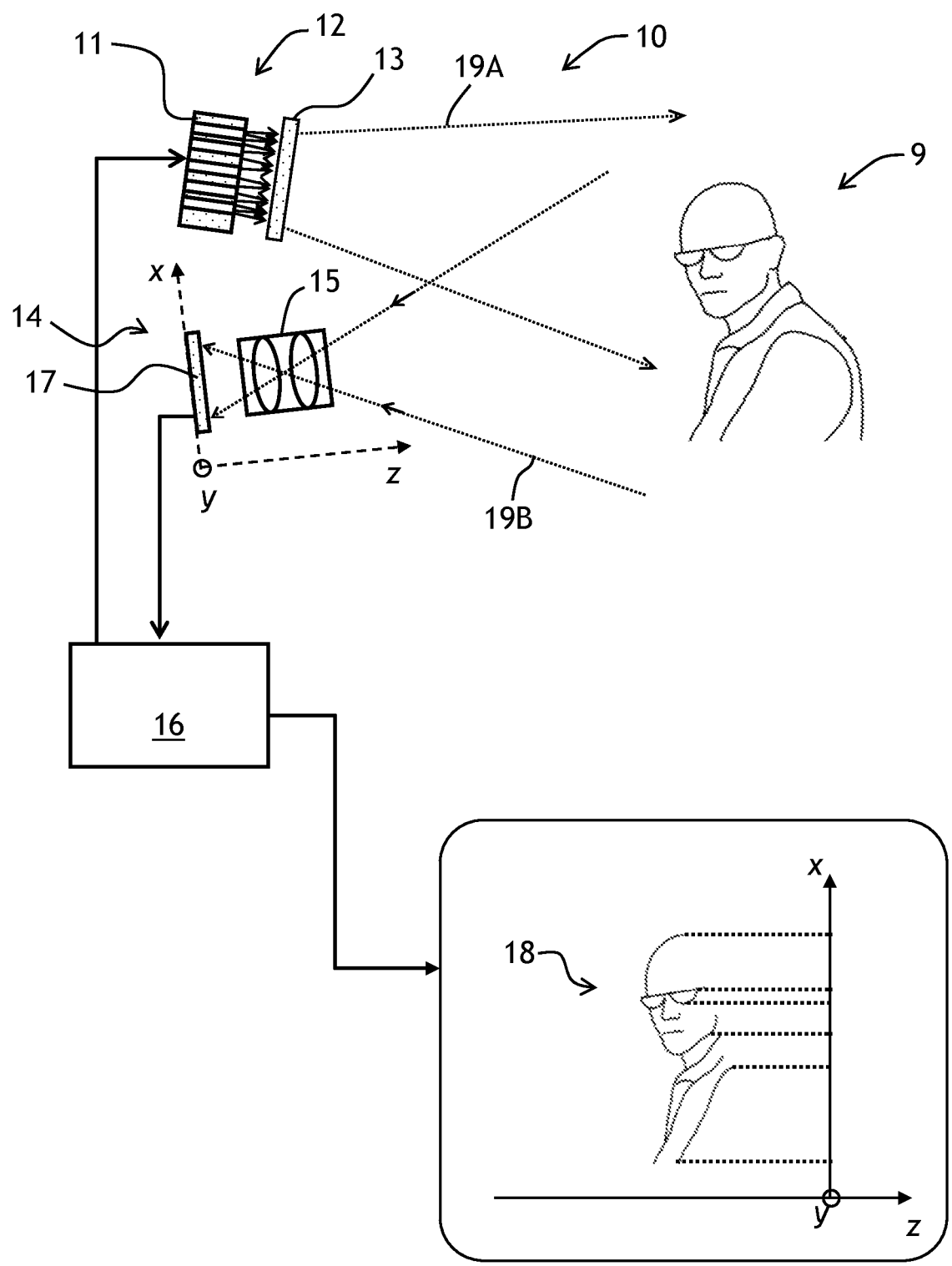
FIG. 1 is a schematic diagram of a range imaging system of the invention.

Referring to FIGS. 1, 2A, and 2B, a range imaging apparatus 10 of the invention includes an illuminator 12 and an optical camera 14. The illuminator 12 and the optical camera 14 are coupled to a controller 16. The illuminator 12 includes a laser diode array 11 and an optional diffuser 13. The diffuser 13 may have some additional functionality. By way of example, it can include an integrated Fresnel lens, no shown. A discrete lens, not shown, could also be inserted before the diffuser. The optical camera 14 includes a lens 15 and a phase-sensitive detector array 17. As seen in FIGS. 2A and 2B, the laser diode array 11 includes a plurality of laser diode emitters 21 disposed on a common semiconductor substrate 22.

In operation, the controller 16 provides a modulated supply current to the laser diode array 11, causing the laser diode array 11 to generate radio-frequency (RF) modulated light, which is diffused and/or reshaped by the diffuser 13 to produce a wide-area RF-modulated illuminating beam 19A for illuminating an object 9 to be imaged. The controller 16 operates the phase-sensitive detector array 17 of the camera 14 in synchronism with the laser diode array 11. The phase-sensitive detector array 17 detects an optical beam 19B reflected from the object 9. The controller 16 generates a depth map 18 of the object 9 from phase delays resulting from propagation of the optical beam 19A emitted by the illuminator to the object 9 and reflected back to the optical camera 14 as the reflected optical beam 19B. The depth map 18 is a three-dimensional plot of "depth", or z-coordinate, for each point of the (x, y) visible field. By way of example, the object 9 of FIG. 1 is a human user, and the depth map 18 is a three-dimensional profile of the user's face and body. Three-dimensional real-time imaging of a user can be employed in gesture-recognition systems, wherein a computer, not shown, determines a time evolution of position and orientation of the head and arms relative to the user's body, and interprets the user's gestures using gesture recognition algorithms.

The range imaging apparatus 10 can be adapted for time-gated range imaging. For time-gated range imaging, a time-gated detector array is used in place of the phase-sensitive detector array 17, effectively making the camera 14 a time-gated camera. The controller 16 is adapted to provide electrical pulses to the laser diode array 11, causing to the laser diode array 11 to generate short light pulses. The controller 16 is adapted to generate the object depth map 18 from time delays resulting from propagation of the light pulses to the object 9 and back to the time-gated optical camera 14. For time-gated range imaging applications, the laser diode array 11 generally has to have higher optical power than for modulated range imaging applications.

The laser diode emitters 21 are preferably single spatial mode emitters having a width of no more than 10 micron and more preferably no more than 5 micron. Single spatial mode emitters are more reliable than multimode laser diode emitters, and typically allow for tighter emitter spacing. They are also easier to screen for "infant mortality" than the multimode emitters. However, when the emitters 21 are multimode, higher optical power levels of the output beam 19A can be achieved.

In the embodiment shown, the laser diode emitters 21 are unevenly spaced. Referring to FIG. 2C, an emitter spacing D is plotted as a function of position 1 of the laser diode emitters 21 across the laser diode array 11. The emitter spacing, or pitch, is defined as center-to-center lateral distance between the individual laser diode emitters 21. It is seen from FIG. 2C that the emitter spacing D is non-uniform across the laser diode array 11. As indicated by a bell-shaped curve 24, the emitter spacing D decreases from a middle of the laser diode array 11, as denoted at 23A, to edges thereof denoted at 23B. The non-uniform emitter spacing facilitates reduction of thermal gradients and associated emitter-to-emitter wavelength spread during operation of the laser diode array 11. Preferably, the emitter spacing at the middle 23A of the laser diode array is smaller than 40 micron, and the emitter spacing at the edges 23B of the laser diode array is larger than 10 micron. This is a much tighter spacing than in laser diode arrays of the prior art where the spacing typically measures 100 micron or more. The minimum emitter spacing is limited by thermal cross talk and/or by defect size that should not span across more than a single emitter.

Although the uneven spacing of the laser diode emitters 21 shown in FIGS. 2A to 2C is advantageous in that it facilitates reduction of thermal gradients, evenly spaced emitters 21 can also be employed in some embodiments of the laser diode emitter array 11. An advantage here is that, at the even spacing D, minimal emitter spacing Dmin can be increased, which can result in reduction of a defect-caused failure rate.

The tight spacing of individual laser diode emitters 21 allows one to reduce the overall width of the semiconductor substrate 22. In one embodiment, the overall width is less than one millimeter; the width can be further reduced to 0.3 mm (300 micron) and smaller, allowing one to use compact and inexpensive heat-sunk packages for packaging the laser diode array 11.

Turning to FIG. 3, a packaged laser diode array 30 includes a header 31, a heat sink 32 mounted on the header 31, and a submount 33 connected to the heat sink 32. The laser diode array 11 is connected, preferably soldered, to the submount 33. The laser diode array 11 can be mounted p-side down onto the submount 33 to reduce the thermal resistance. The p-side of the laser diode array 11 is electrically coupled to a side 34 of the heat sink 32 using first wirebonds 35. The n-side is electrically coupled to an electrode 36 using second wirebonds 37. An additional electrode 39 is connected to an optional photo-diode monitor 38 mounted to the header 31. A cover, not shown, is attached to the header 31 to enclose and shield from environment the heat sink 32, the submount 33, the laser diode array 11, and the photo-diode monitor 38. The cover has a window, not shown, to let an emission 8 of the laser diode array 11 propagate out of the package. The laser diode emitters 21 are preferably connected in parallel, although a serial connection is also possible.

In the embodiment shown, the heat sink 32 is made of copper (Cu), and the submount 33 is made of aluminum nitride (AlN) to bridge the thermal expansion coefficient mismatch between the substrate 22 of the laser diode array 11 and the copper heat sink 32. Other material combinations/systems can be used. For example, when the heat sink 32 is made of a thermally matching material, the submount 33 can be omitted. The reduced width of the laser diode array 11 allows one to save costs of not just the laser diode array, but the cost of the submount 33, the heat sink 32, and the entire package 30. Low costs are particularly important for consumer applications, such as gaming/gesture recognition applications.

Cost, reliability, and performance factors are all interdependent, being influenced by such parameters as a total number of the individual laser diode emitters 21, the emitter spacing D, the width of the semiconductor substrate, submount/heat sink material system, and the like. To improve wall plug efficiency, one can reduce the threshold current and reduce the thermal resistance, which favors fewer laser diode emitters 21. On the other hand, a greater number of the laser diode emitters 21 improves reliability via greater redundancy and/or via less power per emitter.

To investigate tradeoffs between various parameters of the laser diode array 11, a finite element analysis (FEA) modeling of thermal resistance of the laser diode array 11 was performed for the AlGaAs laser diode emitters 21 on the GaAs substrate 22 packaged into a TO-can package. The following parameters were varied: number of the laser diode emitters 21, the emitter spacing D, and the laser diode cavity length. Table 1 below illustrates results from the FEA. The thermal resistance Rth was then inputted into a laser-diode model to predict actual output power performance. This was done iteratively, to determine parameters corresponding to the lowest cost per Watt at a given reliability requirement.

TABLE 1

| Number of Emitters (N) | Cavity Length (Lc), mm | Emitter spacing (pitch) D, micron | Rth (° C./W), peak (from FEA) |
|---|---|---|---|
| 10 | 0.5 | 10 | 24.8 |
|  |  | 20 | 21.4 |
|  |  | 40 | 18.2 |
|  | 1 | 10 | 15.6 |
|  |  | 20 | 13.8 |
|  |  | 40 | 12.6 |
|  | 2 | 10 | 11.2 |
|  |  | 20 | 10.4 |
|  |  | 40 | 9.8 |
| 20 | 0.5 | 10 | 18.3 |
|  |  | 20 | 15.1 |
|  |  | 40 | 12.8 |
|  | 1 | 10 | 12.3 |
|  |  | 20 | 10.9 |
|  |  | 40 | 9.5 |
|  | 2 | 10 | 9.6 |
|  |  | 20 | 10.0 |
|  |  | 40 | 8.0 |

As seen from Table 1, the number of emitters N, the cavity length Lc, and the emitter spacing (pitch) D all affect the thermal resistance Rth. As the emitter spacing D is increased beyond a certain value, little additional reduction in thermal resistance Rth occurs, because the thermal cross talk between neighboring emitters becomes small.

To achieve typical reliability targets for consumer electronics, at least five emitters, for example with ≤2 mm cavity length and 20±5 micron spacing, are preferably used for operation at 2 Watts optical power levels at the temperature of the packaged laser diode array 30 of up to 60° C.

A near-infrared wavelength range useful in Gesture Recognition (GR) and computer interface applications spans from 800 to 1600 nm. Of this range, the range of 800 nm to 1100 nm is covered by a laser diode material system including AlGaAs on GaAs substrate or GaInP/GaAsInP on GaAs substrate, the range of 1100 nm to 1600 nm is covered by a laser diode material system including InGaAsP on InP substrate or InGaAlAs on InP substrate. Laser diodes on GaAs substrate have a better electrical/light conversion efficiency and better performance at high temperature of use; but they can suffer from Catastrophic Optical Damage (COD). The presently available detectors for the wavelength range of 800 nm to 1100 nm are not very efficient, requiring higher optical power levels of the illuminator 12. Wavelengths higher than 1300 nm offer much better eye safety than shorter wavelengths, and laser diodes operating at wavelengths over 1400 nm are substantially free of COD; but the thermal performance is not as good at these wavelengths. One can use InGaAs detectors giving much better detection sensitivity at wavelengths of between 1300 and 1600 nm than Ge or Si based detectors operating at wavelengths of between 800 nm and 900 nm, requiring less emitted power.

Therefore, when high temperature environment is of a concern, AlGaAs, GaInP, or GaAsInP laser diode emitters 21 on GaAs substrate 22, operating in a wavelength range of 800 to 1100 nm, can offer a better choice. When eye safety and reliability are of a concern, InGaAsP or InGaAlAs laser diode emitters 21 on InP substrate 22, operating at wavelengths of 1300 to 1600 nm, are generally a better choice. It is to be understood that various embodiments of the present invention encompass all these material systems and operating wavelengths.

Figure 4:
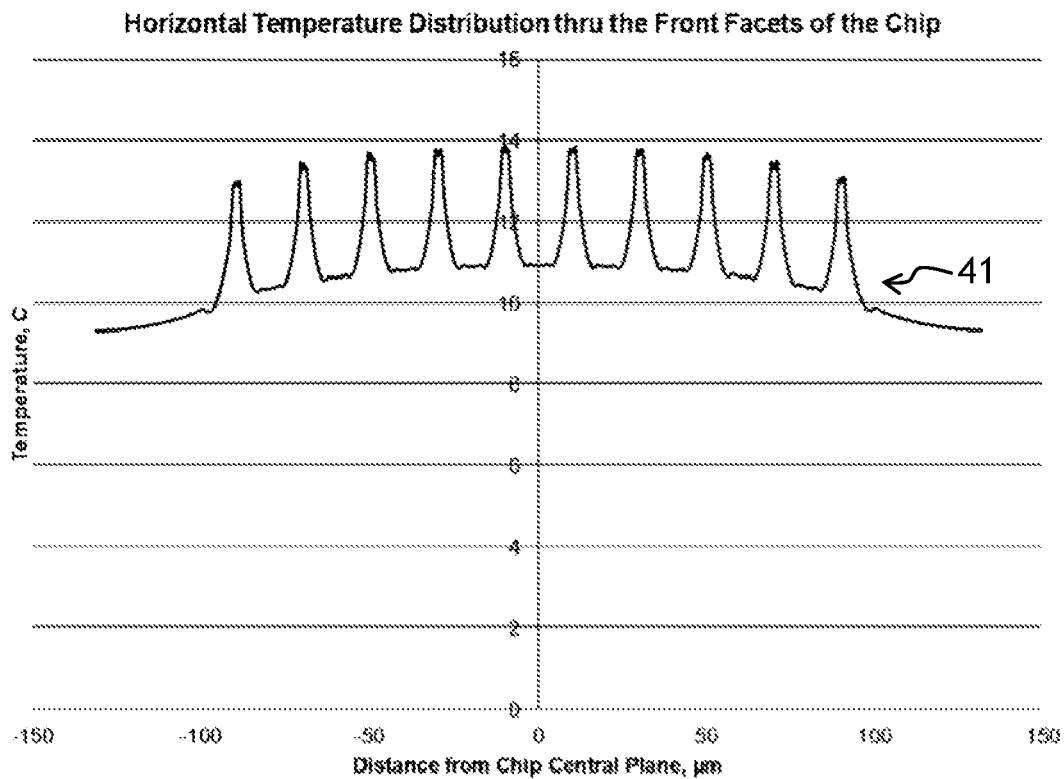
FIG. 4 is a graph of a simulated temperature distribution across a laser diode array having uniform emitter spacing.

FIG. 4 shows a simulated temperature distribution 41 of an embodiment of the laser diode array 11, having ten evenly-spaced emitters 21 at the emitter spacing D of 20 micron. The multi-emitter laser diode array 11 has a thermal resistance Rth lower by approximately 20% than the thermal resistance of a single-emitter laser diode of similar dimensions and output optical power.

One can see that an average temperature is higher at the middle of the distribution 41, which creates a thermal gradient in going form the middle 23A of the laser diode array 11 to its sides 23B. This can be problematic for some applications, because an emission wavelength of the individual laser diode emitters 21 depends on the temperature, creating an undesirable emitter-to-emitter wavelength spread. To reduce the wavelength spread, the laser diode emitters 21 can have a non-uniform emitter spacing D along the laser diode array 11 as shown in FIGS. 2A to 2C and explained above. This has been demonstrated to reduce the peak thermal resistance by ~10%, at a same total die width and cost. In GR applications, a band pass filter is used to screen out stray background light, so it is desirable to reduce the wavelength bandwidth to improve the overall signal-to-noise ratio by reducing the filter transmission bandwidth.

Figure 5:
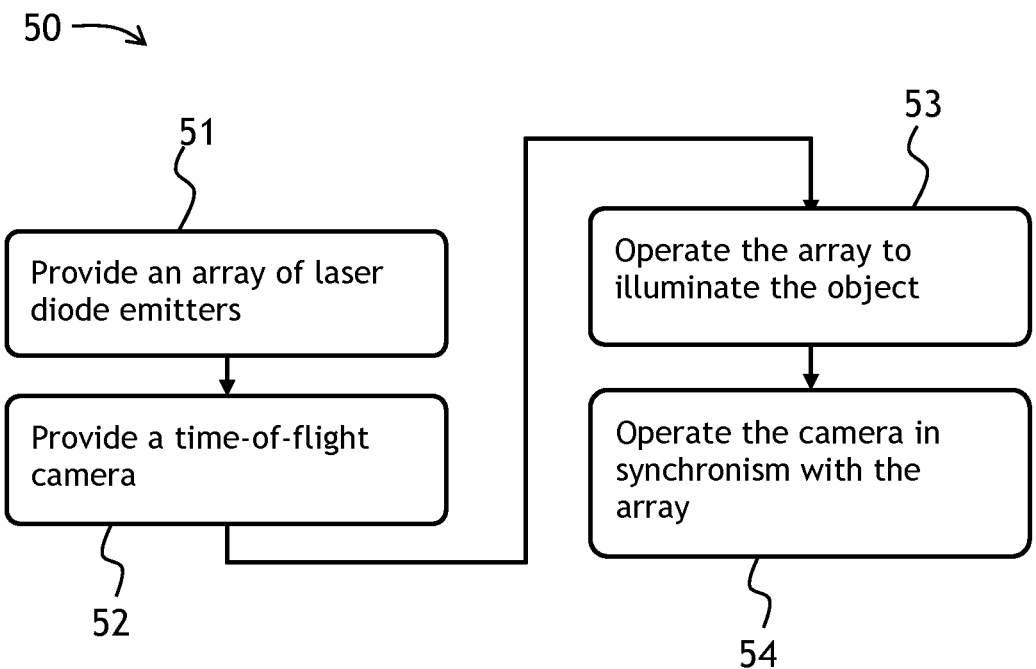
FIG. 5 is a block diagram of a method of range imaging according to the invention.

Turning to FIG. 5, a method 50 of range imaging of the object 9 includes a step 51 of providing the array 11 of the laser diode emitters 21, and a step 52 of providing the time-of-flight camera 14. Once the laser diode array 11 and the camera 14 are provided, the laser diode array 11 is operated provide pulsed or modulated illumination of the object 9 in a step 53, and the optical camera 14 is operated in synchronism with the laser diode array 11 in a step 54, to provide the object depth map 18 from phase or time delays resulting from propagation of the light beam 19A emitted by the illuminator to the object 9, and propagation of the reflected light beam 19B back to the optical camera 14.

In one embodiment, the method 50 further includes steps of monitoring output optical power of the laser diode array 11, and increasing an electrical current supplied to the laser diode array 11 upon determining a drop of output optical power due to a failure of at least one of the plurality of the laser diode emitters 21 of the laser diode array 11.

As noted above, the laser diode emitters 21 can have the non-uniform emitter spacing D along the laser diode array 11, the emitter spacing D decreasing from the middle of the laser diode array 11 to the edges of the array 11, to reduce thermal gradients and associated emitter-to-emitter wavelength spread. Single-mode laser diode emitters 21 are preferred.

The foregoing description discloses an example of use of the laser diode array 11 including a plurality of the laser diode emitters 21 on the common semiconductor substrate 22 as an illuminator for the range imaging apparatus 10. It is to be understood that, according to the invention, any laser diode array 11 can be packaged in any suitable package, and can be used in any range imaging application as an illuminator, as long as it meets required speed and output power specifications required for that application. Laser diode arrays having of width of less than 1 mm and preferably less than 0.3 mm are particularly useful in range imaging/time-of-flight systems and applications.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus for range imaging, comprising:
an illuminator for providing pulsed or modulated illumination of an object, and
an optical camera for time-gated or phase-sensitive imaging of the object illuminated with the illuminator,
wherein the illuminator comprises a laser diode array including a plurality of laser diode emitters on a common semiconductor substrate, and wherein the laser diode emitters have a non-uniform emitter spacing along the laser diode array, the emitter spacing decreasing from a middle of the laser diode array to edges thereof, to reduce thermal gradients and associated emitter-to-emitter wavelength spread during operation of the laser diode array.

2. The apparatus of claim 1, further comprising a controller coupled to the illuminator and to the optical camera, for providing an object depth map from phase or time delays resulting from propagation of light emitted by the illuminator to the object and back to the optical camera.

3. The apparatus of claim 1, wherein the laser diode emitters are single spatial mode emitters.

4. The apparatus of claim 3, wherein the laser diode emitters have a width of no more than 10 micron.

5. The apparatus of claim 1, wherein the emitter spacing at the middle of the laser diode array is smaller than 40 micron, and the emitter spacing at the edges of the laser diode array is larger than 10 micron.

6. The apparatus of claim 1, wherein a width of the laser diode array is less than one millimeter.

7. The apparatus of claim 1, wherein the laser diode emitters are electrically connected in parallel.

8. A method for range imaging of an object, comprising:
providing a laser diode array including a plurality of laser diode emitters on a common semiconductor substrate, wherein the laser diode emitters have a non-uniform emitter spacing along the laser diode array, the emitter spacing decreasing from a middle of the laser diode array to edges thereof, to reduce thermal gradients and associated emitter-to-emitter wavelength spread during operation of the laser diode array;
operating the laser diode array to provide pulsed or modulated illumination of the object; and
operating, in synchronism with the laser diode array, an optical camera for time-gated or phase-sensitive imaging of the object, to provide an object depth map from phase or time delays resulting from propagation of light emitted by the laser diode array to the object and back to the optical camera.

9. The method of claim 8, wherein the laser diode emitters are single spatial mode emitters.

10. The method of claim 8, further comprising heat sinking the semiconductor substrate.

11. The method of claim 8, further comprising monitoring output optical power of the laser diode array, and increasing an electrical current supplied to the laser diode array upon determining a drop of output optical power due to a failure of at least one of the plurality of the laser diode emitters of the laser diode array.

* * * * *